(12) United States Patent
Nishimura (10) Patent No.: US 7,615,819 B2
(45) Date of Patent: Nov. 10, 2009

(54) SEMICONDUCTOR DEVICE

(75) Inventor: Takaharu Nishimura, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 26 days.

(21) Appl. No.: 11/768,249

(22) Filed: Jun. 26, 2007

(65) Prior Publication Data

US 2008/0012146 A1 Jan. 17, 2008

(30) Foreign Application Priority Data

Jun. 30, 2006 (JP) .............................. 2006-181550

(51) Int. Cl.
*H01L 23/62* (2006.01)
*H01L 23/48* (2006.01)
(52) U.S. Cl. ..................... 257/314; 257/315; 257/316; 257/758; 257/E23.011
(58) Field of Classification Search ................. 257/314, 257/315, 316, 758, E23.011, 142, 145
See application file for complete search history.

(56) References Cited

U.S. PATENT DOCUMENTS 5,144,579 A 9/1992 Okabe et al.
7,326,993 B2* 2/2008 Kajimoto et al. ............ 257/315
2005/0051831 A1* 3/2005 Kajimoto et al. ............ 257/314

FOREIGN PATENT DOCUMENTS

JP 2000-150637 5/2000

* cited by examiner

*Primary Examiner*—Howard Weiss
*Assistant Examiner*—Steven H Rao
(74) *Attorney, Agent, or Firm*—Oblon, Spivak, McClelland, Maier & Neustadt, L.L.P.

(57) ABSTRACT

A semiconductor device includes a semiconductor substrate, an insulating film formed above an upper surface of the substrate and including a contact hole penetrating the insulating film, a wiring portion formed on the insulating film, and a contact plug formed in the contact hole and including a first conductive plug formed in a lower portion of the contact hole so that the exposed upper surface of the semiconductor substrate is in contact with the first conductive plug and a second conductive plug formed on the first conductive plug, so that the wiring portion is in contact with the second conductive plug. The first and second conductive plugs have an interface with a height that is lower than a height of the boundary portion relative to an upper surface of the semiconductor substrate.

16 Claims, 7 Drawing Sheets

SEMICONDUCTOR DEVICE

CROSS-REFERENCE TO RELATED APPLICATIONS

This application is based on and claims the benefit of priority from the prior Japanese Patent Application No. 2006-181550, filed on Jun. 30, 2006, the entire contents of which are incorporated herein by reference.

BACKGROUND OF THE INVENTION

1. Field of the Invention

The present invention relates to a semiconductor device having contact holes formed on a semiconductor substrate and a method of fabricating the same.

2. Description of the Related Art

For example, JP-2000-150637A discloses a technique of forming contact holes on a source/drain region of a semiconductor substrate. In this technique, first and second silicon oxide films are stacked into a two-layer structure on the semiconductor substrate as an interlayer insulating film. Each contact hole includes a vertical side wall extending through a second silicon oxide film and a tapered face extending through a first silicon oxide film. A metal wiring layer is connected to the source/drain region via the contact holes provided in the interlayer insulating film.

A diameter of the contact hole has recently been reduced with recent reduction in design rules and element refinement. Accordingly, this results in an increase in the aspect ratio and consequently, since an aspect ratio is increased, a filling property is reduced when the contact hole is filled with a metal wiring layer. When the filling property is low, seams occur in the metal wiring layer, which results in an increase in a resistance value of the metal wiring layer.

BRIEF SUMMARY OF THE INVENTION

Therefore, an object of the present invention is to provide a semiconductor device in which the resistance value of the wiring layer in the contact hole can be suppressed and a method of fabricating such a semiconductor device.

According to one aspect of the present invention, there is provided a semiconductor device including a semiconductor substrate having an upper surface, an insulating film formed above the upper surface of the semiconductor substrate, the insulating film including a contact hole penetrating the insulating film, the contact hole including an upper portion, a lower portion located below the upper portion and a boundary portion connecting the upper portion and the lower portion, the upper portion including an upper end having a first inner width the same as a second inner width of the boundary portion, the lower portion including a lower end having a third inner width smaller than the second width, a wiring portion formed on the insulating film, and a contact plug formed in the contact hole, including a first conductive plug formed in the lower portion of the contact hole so that the exposed upper surface of the semiconductor substrate is in contact with the first conductive plug and a second conductive plug formed on the first conductive plug, so that the wiring portion is in contact with the second conductive plug, the first conductive plug including a polycrystalline silicon film and the second conductive plug being comprised of a conductive material film which differs from the polycrystalline silicon film, wherein the first and second conductive plugs have an interface with a height that is lower than a height of the boundary portion relative to the upper surface of the semiconductor substrate.

The invention also provides a semiconductor device comprising a semiconductor substrate including an upper surface, an insulating film formed above the upper surface of the semiconductor substrate, the insulating film including a contact hole penetrating the insulating film to expose the first upper surface, the contact hole including an upper portion and a lower portion located on the upper portion via a boundary portion as a first lower end of the upper portion and a first upper end of the lower portion, the upper portion including a second upper end having a first inner width, the boundary portion including a second inner width being same as the first inner width, and the lower portion including a second lower end having a third inner width being narrower than the second inner width, a first conductive material including a first filling property and formed in the lower portion of the contact hole so that the exposed upper surface of the semiconductor substrate is contact to the first conductive plug, and a second conductive material including a second filling property being worse than the first filling property of the first conductive plug and formed on the first conductive plug.

In another aspect, the invention provides a method of fabricating a semiconductor device, comprising forming an insulating film on an upper surface of a semiconductor substrate, forming a contact hole in the insulating film to expose the upper surface so that the contact hole includes an upper portion, a lower portion and a boundary portion located between the upper and the lower portions, the upper portion has a first inner width, the boundary portion has a second inner width which is same as the first inner width of the upper portion, the lower portion has a third inner width which is smaller than the second inner width of the boundary portion, forming a first conductive plug from the exposed upper surface of the semiconductor substrate to a first level which is lower than a second level of the boundary portion relative to the upper surface of the semiconductor substrate, and forming a second conductive plug which is different from the first conductive plug on the first conductive plug.

BRIEF DESCRIPTION OF THE DRAWINGS

Other objects, features and advantages of the present invention will become clear upon reviewing the following description of one embodiment with reference to the accompanying drawings, in which.

DETAILED DESCRIPTION OF THE INVENTION

One embodiment of the present invention will be described with reference to the accompanying drawings. The invention is applied to a NAND flash memory device 1 or more specifically, the structure of a bit-line contact region of the NAND flash memory device 1 in the embodiment.

Figure 1:
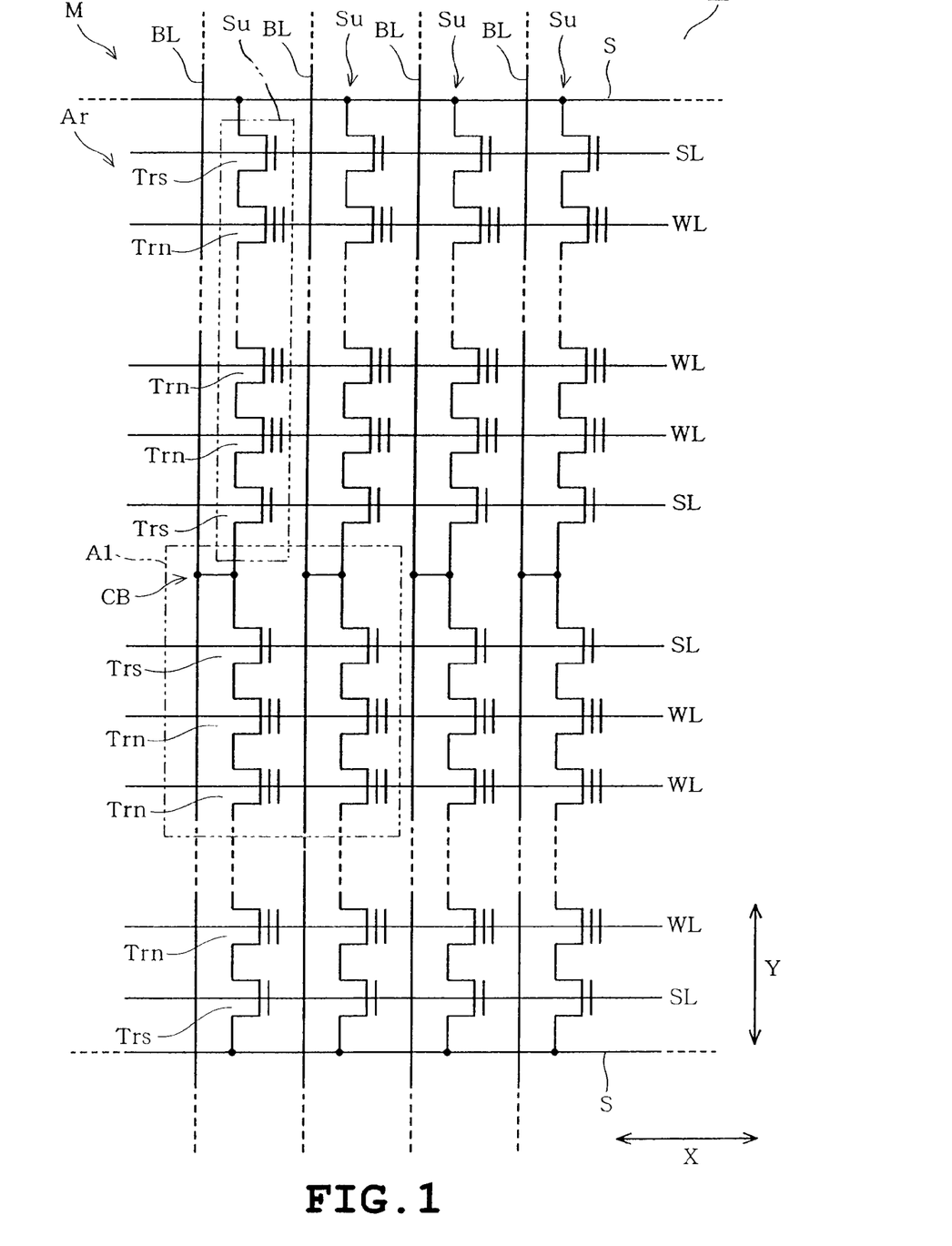
FIG. 1 is a diagram showing an electrical arrangement of a semiconductor device in accordance with one embodiment of the present invention.

Referring to FIG. 1, a circuit equivalent to a memory cell array of the NAND flash memory device 1 (a non-volatile semiconductor memory device) is shown. The NAND flash memory device 1 includes a memory cell array Ar composed of NAND cell units Su arranged in an array of rows and columns. Each NAND cell unit Su comprises two selective gate transistors Trs and a plurality of memory cell transistors Trn (8: 2$^n$ where n is a positive integer, for example) series-connected to each other with an impurity layer (source/drain region) commonly used between the selective gate transistors Trs.

The memory cell transistors Trn arranged in the X direction (the direction of word line) in FIG. 1 are commonly connected to a word line (control gate line) WL. Furthermore, the selective gate transistors Trs arranged in the X direction in FIG. 1 are commonly connected to a selective gate line SL. Additionally, the selective gate transistors Trs are connected via plugs 8 and 9 (see FIG. 3) to a bit line BL extending in the Y direction (in the direction of bit line) perpendicular to the X direction. Each of the plugs 8 and 9 is composed in a bit line contact forming region CB.

Figure 2:
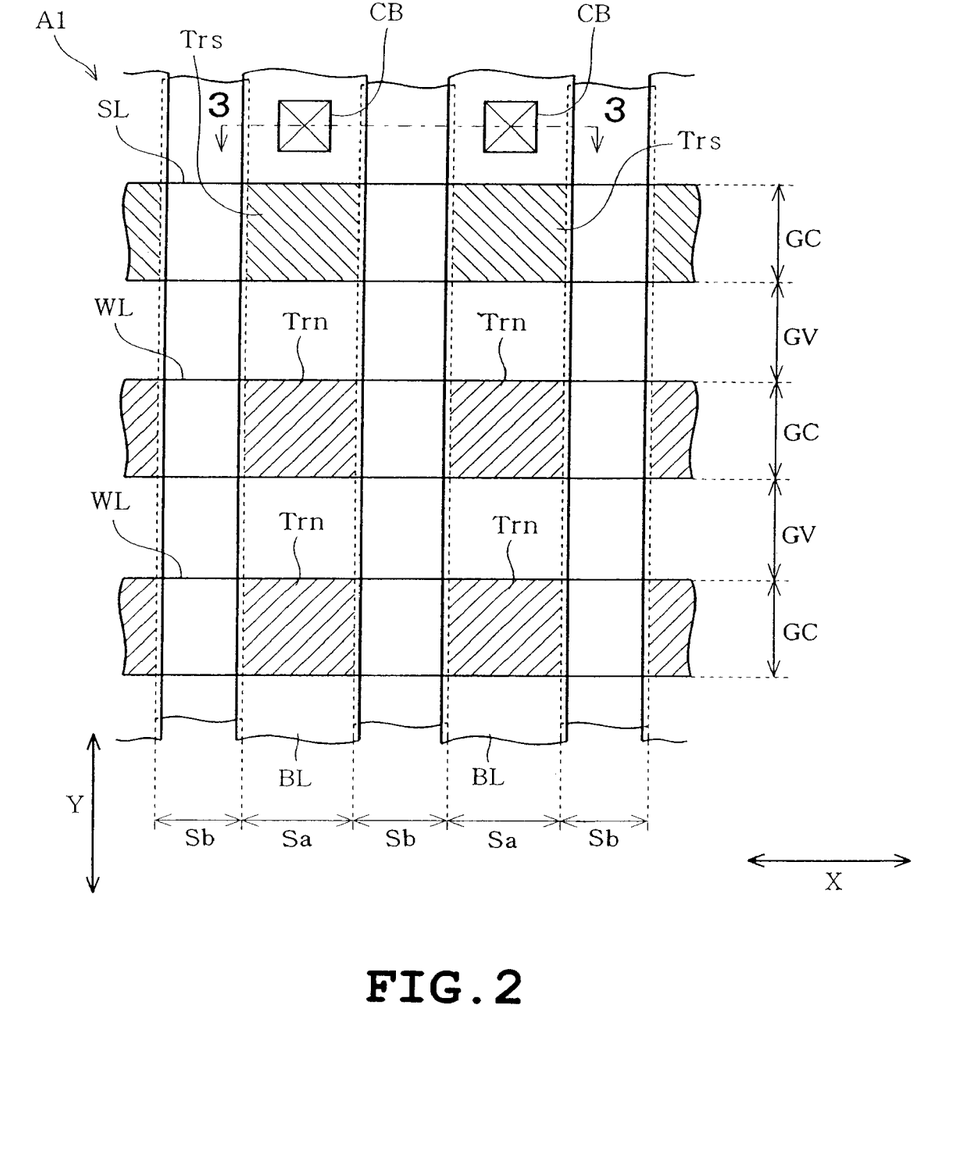
FIG. 2 is a schematic plan view of the semiconductor device.

A plurality of NAND cell units Su are divided by an element isolation region Sb of a shallow trench isolation (STI) structure in the X direction as shown in FIG. 2. Each memory cell transistor Trn includes a floating gate electrode (not shown) which is formed so as to be located at a crossover site of element forming regions extending in the Y direction (active area) Sa and AA and each word line WL which is formed at predetermined intervals in the Y direction so as to extend in the X direction.

Structure of Bit Line Contact CB

Figure 3:
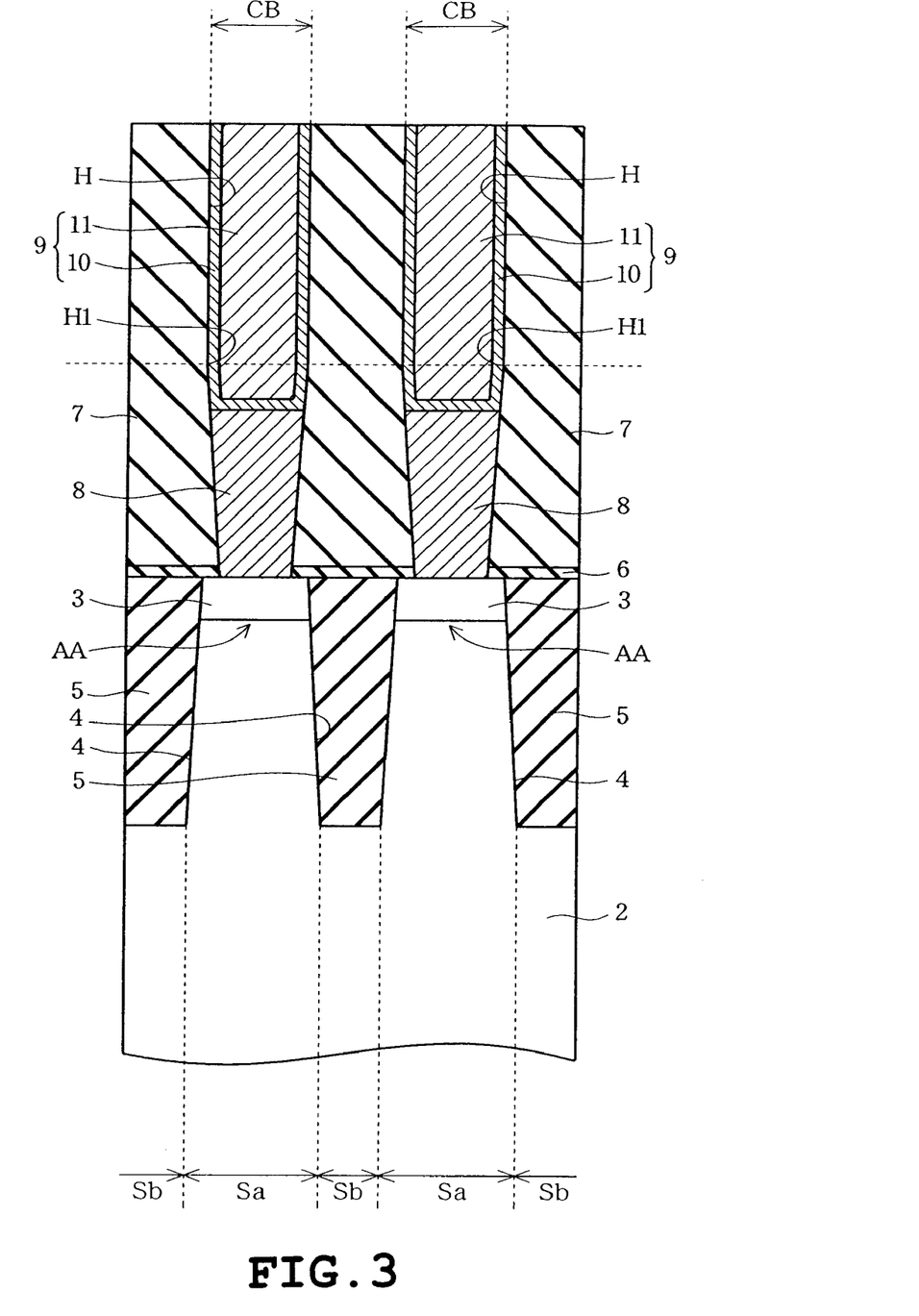
FIG. 3 is a schematic sectional view taken along line 3-3 in FIG. 2.

The following will describe in detail the structure of the bit line contact CB which is a characteristic part of the embodiment and the structure of a peripheral area. As shown in FIG. 3, a plurality of impurity diffusion layers 3 (diffusion area: impurity introducing layer) are formed as source/drain regions in the active areas Sa and AA separated by the element isolation region so as to be located in a surface layer of a p-type silicon substrate 2 serving as the semiconductor substrate.

The element isolation region Sb is fabricated by forming a trench 4 in a surface layer of the silicon substrate 2 and burying an element isolation insulating film 5 in the trench 4. The element isolation insulating film 5 comprises a film having as a main component, tetraethyl orthosilicate (TEOS), for example. A silicon nitride film 6 is formed as an insulating film on the surface of the silicon substrate 2. An interlayer insulating film 7 is formed as an insulating film on the silicon nitride film 6. The interlayer insulating film 7 comprises a silicon oxide film containing TEOS and/or boro-phospho-silicate glass (BPSG).

The interlayer insulating film 7 has a contact hole H which is formed therethrough so as to extend from a conductive layer (aluminum metal layer (not shown), for example) located at the upper layer side to an upper face of the impurity diffusion layer 3. The contact hole H includes an upper part and a lower part. The contact hole H has an upper side face which is located over the impurity diffusion layer 3 so as to be formed into a columnar shape perpendicular to the surface of the silicon substrate 2. The lower part of the contact hole H is formed into a tapered shape and has a maximum diameter at an inflection location H1 (corresponding to a lower end of the hole with a vertical columnar shape) which is a boundary between the upper and lower parts. The diameter of the lower part is gradually reduced as the lower part comes close to the silicon substrate 2 and becomes minimum at a boundary between the silicon substrate 2 and the lower part. The inflection location H1 is preferably located at a level which is adjusted so as to be equal to one half to one third of a level of the contact hole H.

The polyplug 8 is buried in the lower part of the contact hole H so as to range from the surface of the silicon substrate 2 to a predetermined location which is lower than the inflection location H1 relative to the silicon substrate 2. The polyplug 8 is comprised of polycrystalline silicon doped with impurities. Since the lower part of the contact hole H is formed into a tapered hole, the polyplug 8 is desirably buried in the contact hole H without void formation. In other words, high resistance can be suppressed in the region where the polyplug 8 is buried.

The polyplug 8 extends from the surface of the silicon substrate 2 to the level lower than the inflection location H1 of the contact hole H. An upper layer side metal plug 9 is buried in the contact hole H so as to be located over the polyplug 8. The metal plug 9 reaches the uppermost end of the contact hole H. The polyplug 8 and the metal plug 9 compose the bit line contact CB.

The metal plug 9 includes a thin barrier metal film 10 formed on an upper surface of polyplug 8 and a sidewall of the contact hole H and a tungsten layer 11 which is formed inside the barrier metal film 10 so as to fill the contact hole H. The barrier metal film 10 is composed of a stacked film structure of Ti/TiN, for example and provided for avoiding the structural contact between the tungsten layer 11 and the interlayer insulating film 7.

According to the above-described structure of the embodiment, the contact hole H includes the lower part formed into the tapered shape and the upper part formed into the vertical shape. The polyplug 8 is buried in the lower part of the contact hole H so as to extend from the surface of the silicon substrate 2 to the level lower than the inflection location H1. Since the metal plug 9 is formed on the polyplug 8, void can be prevented from being formed inside the tapered portion of the lower part of the contact hole H. Moreover, an aspect ratio in the case where the metal plug 9 is buried in the contact hole H is lower than an aspect ratio in the case where the metal plug 9 is buried in the contact hole H so as to reach the surface of the silicon substrate 2. Accordingly, the filling property of the metal plug 9 is improved such that high resistivity of the bit line contact CB composed of the plugs 8 and 9 can be suppressed.

Since the contact hole H includes the tapered lower part and the vertical columnar upper part, the difference between hole diameters of the upper and lower ends of the contact hole H can be suppressed as compared with the case where the whole contact hole is formed into a tapered shape. As a result, since the bottom contact area of the polyplug 8 relative to the silicon substrate 2 is ensured so as to meet a desired property, the contact resistance can be reduced between the polyplug 8 and the silicon substrate 2.

Fabricating Method

A fabricating method will now be described with reference to FIGS. 4 to 7. The following description centers upon the fabricating process of the bit line contact CB. If the invention can be accomplished, the following process may be eliminated or another general process may be added. Since the embodiment is characterized by a process of fabricating an upper layer side structure of the surface of the silicon substrate 2, the description of a process of fabricating the surface layer structure of the silicon substrate 2 beneath the surface thereof will be eliminated.

Figure 4:
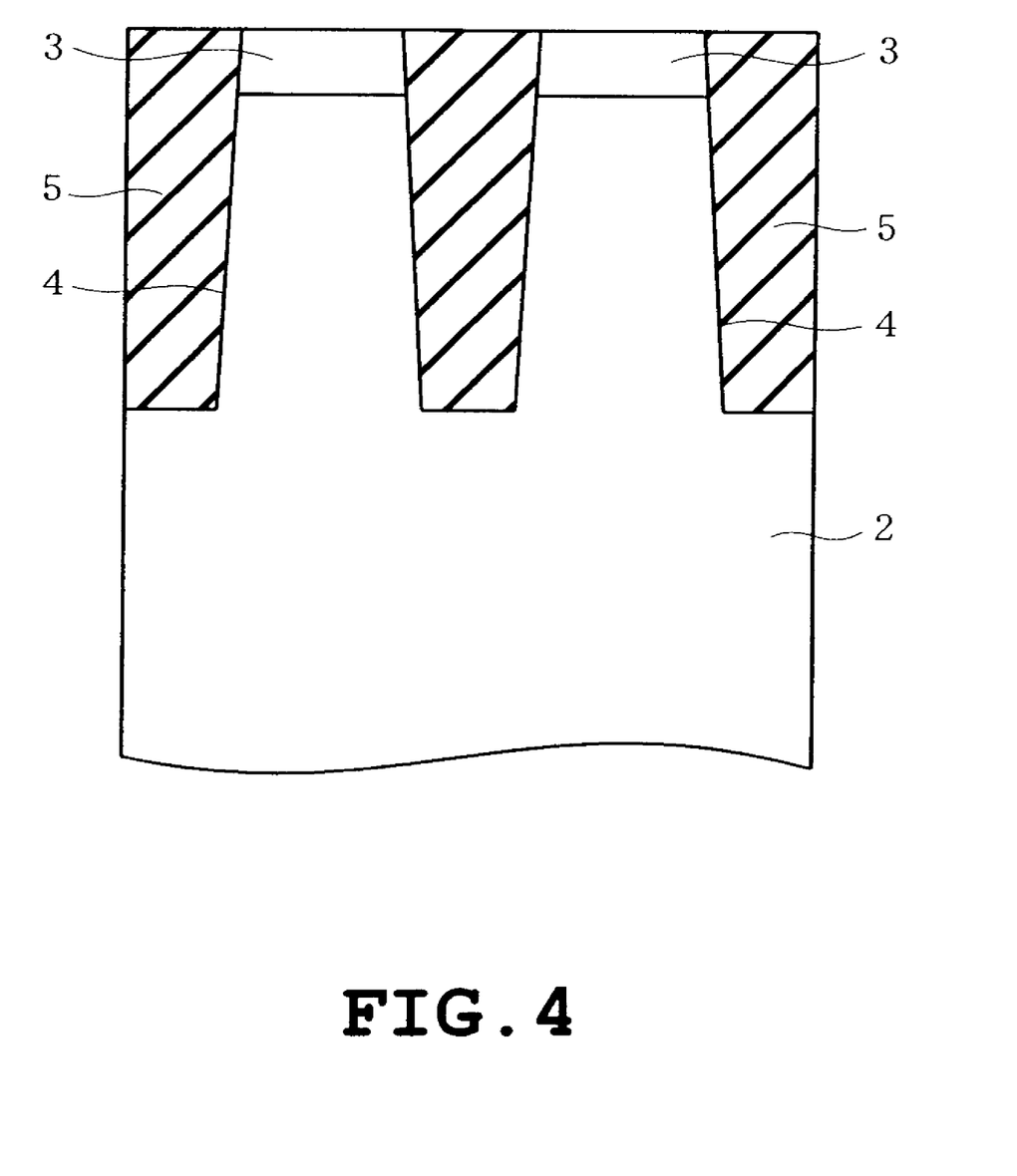
FIGS. 4 to 7 are views showing one fabricating process.

Referring to FIG. 4, a plurality of trenches 4 are formed in the silicon substrate 2. The element isolation film 5 is buried in each trench 4. The impurity diffusion layer 3 is formed in the surface layer of the silicon substrate 2 between the element isolation films 5 adjacent to each other. Each impurity diffusion layer 3 is made by an implantation technique and thermal diffusion of impurities. In FIG. 4, the impurity diffusion layer 3 has a surface width of 70 nm and the element is olation insulating film 5 has a surface width of about 70 nm, for example.

Figure 5:
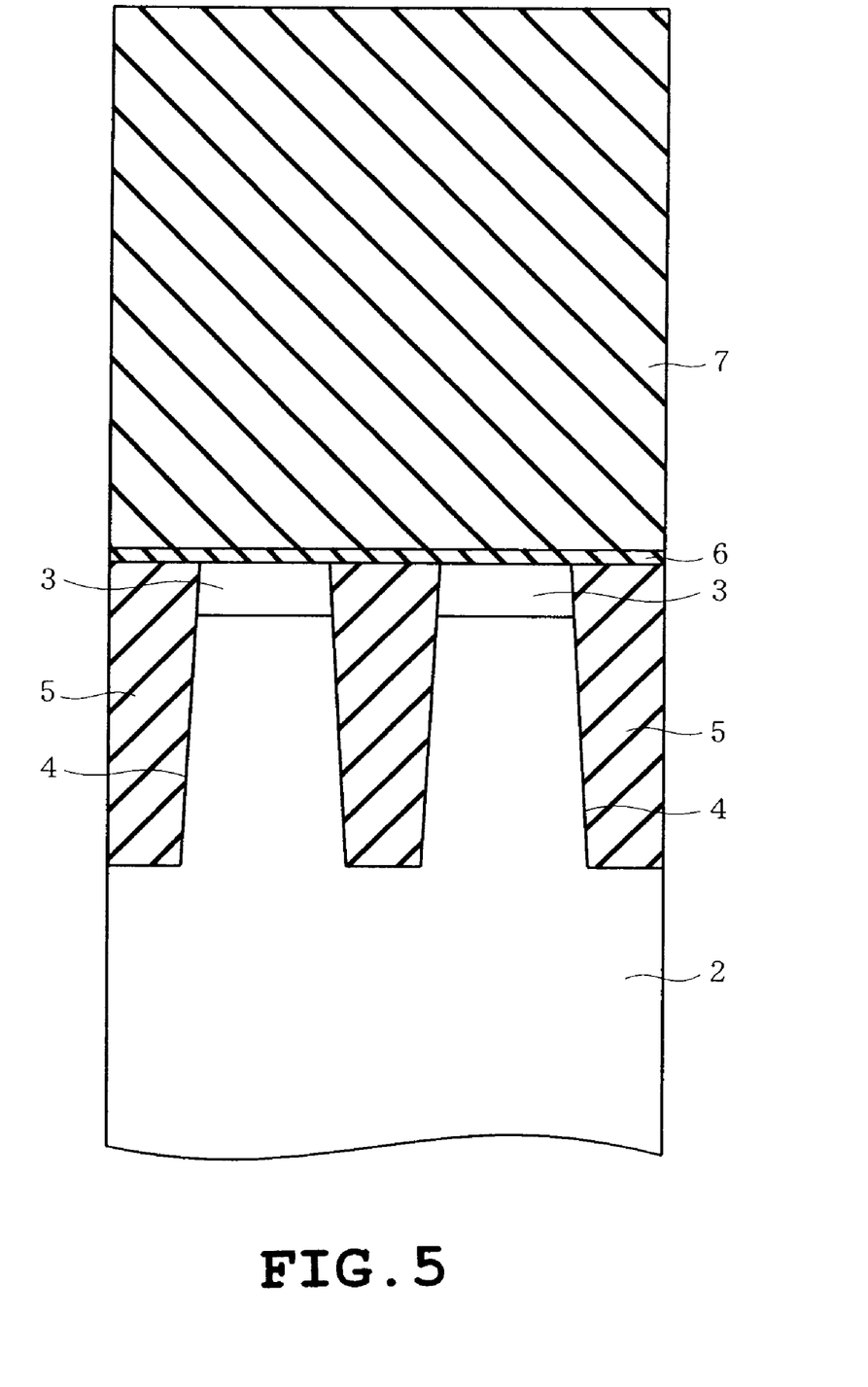

Subsequently, the silicon nitride film 6 with the length of, for example, 20 nm is formed on the silicon substrate 2 and the element isolation insulating film 5 as shown in FIG. 5. Furthermore, the interlayer insulating film 7 comprising a silicon oxide film is deposited, for example, 600 nm on the silicon nitride film 6.

Figure 6:
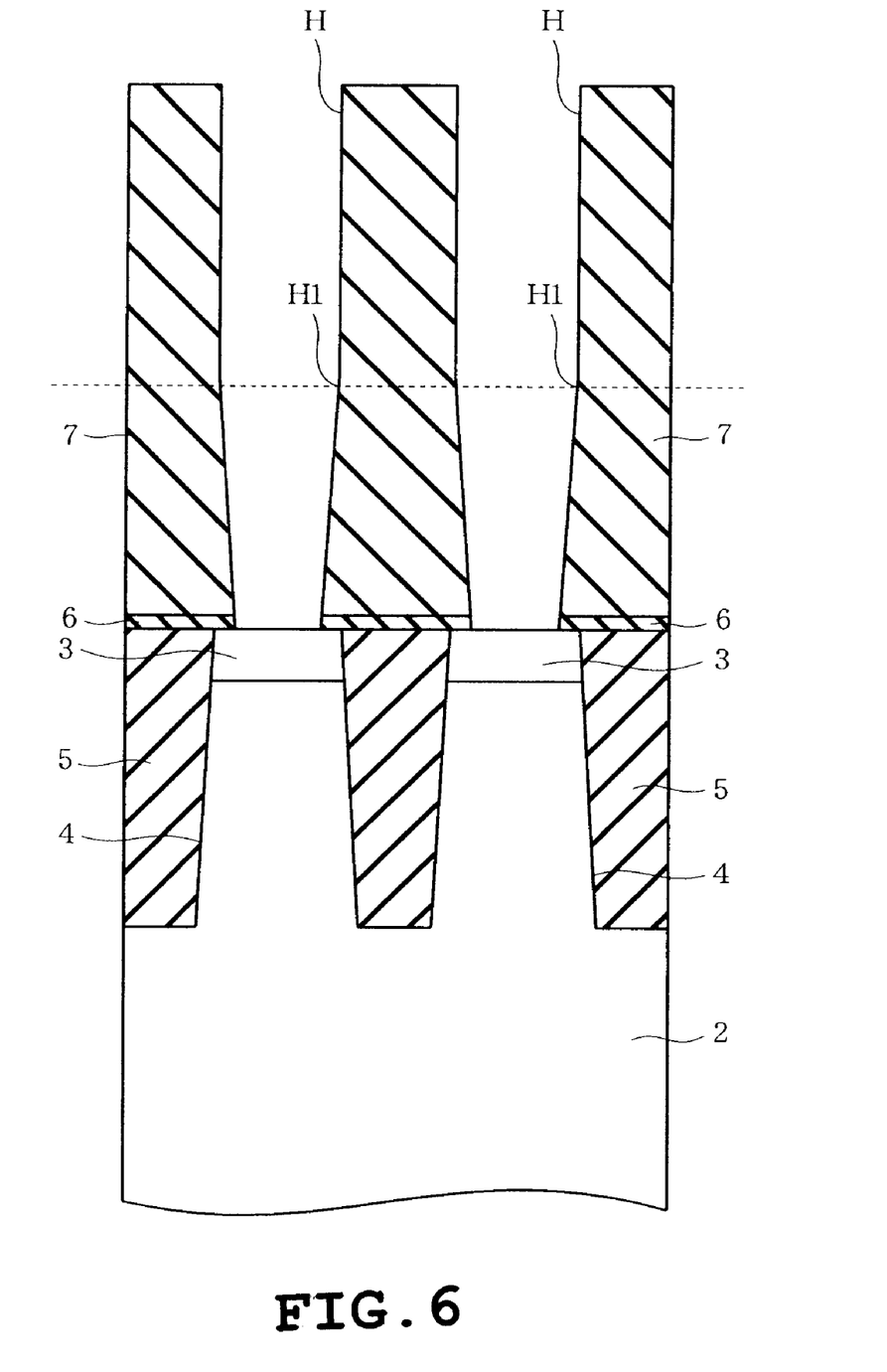

Subsequently, the contact hole H is formed through the interlayer insulating film 7 and the silicon nitride film 6 so that the upper surface of the impurity diffusion layer 3 is exposed, as shown in FIG. 6. In forming the contact hole H, a reactive ion etching (RIE) is carried out with use of an oxide gas and a fluorocarbon gas such as $CHF_3$ or $CF_4$ gas. By changing a condition of a flux of the oxide gas and the fluorocarbon gas, the contact hole H is formed so that the inflection location H1 is located at the level which is adjusted so as to be equal to one half to one third of the level of the contact hole H (the location spaced away about 200 nm from the lowermost position of the interlayer insulating film 7, for example). More specifically, a part of the contact hole H located above the inflection location H1 is formed so as to be vertical relative to the surface of the silicon substrate 2. A part of the contact hole H located below the inflection location H1 is tapered into a downwardly convex shape. In other words, the contact hole H is formed so that the diameter thereof is minimum on the surface of the silicon substrate 2. The diameter of the contact hole H is 80 nm at the uppermost part thereof and 50 nm at the surface of the silicon substrate 2, for example.

Figure 7:
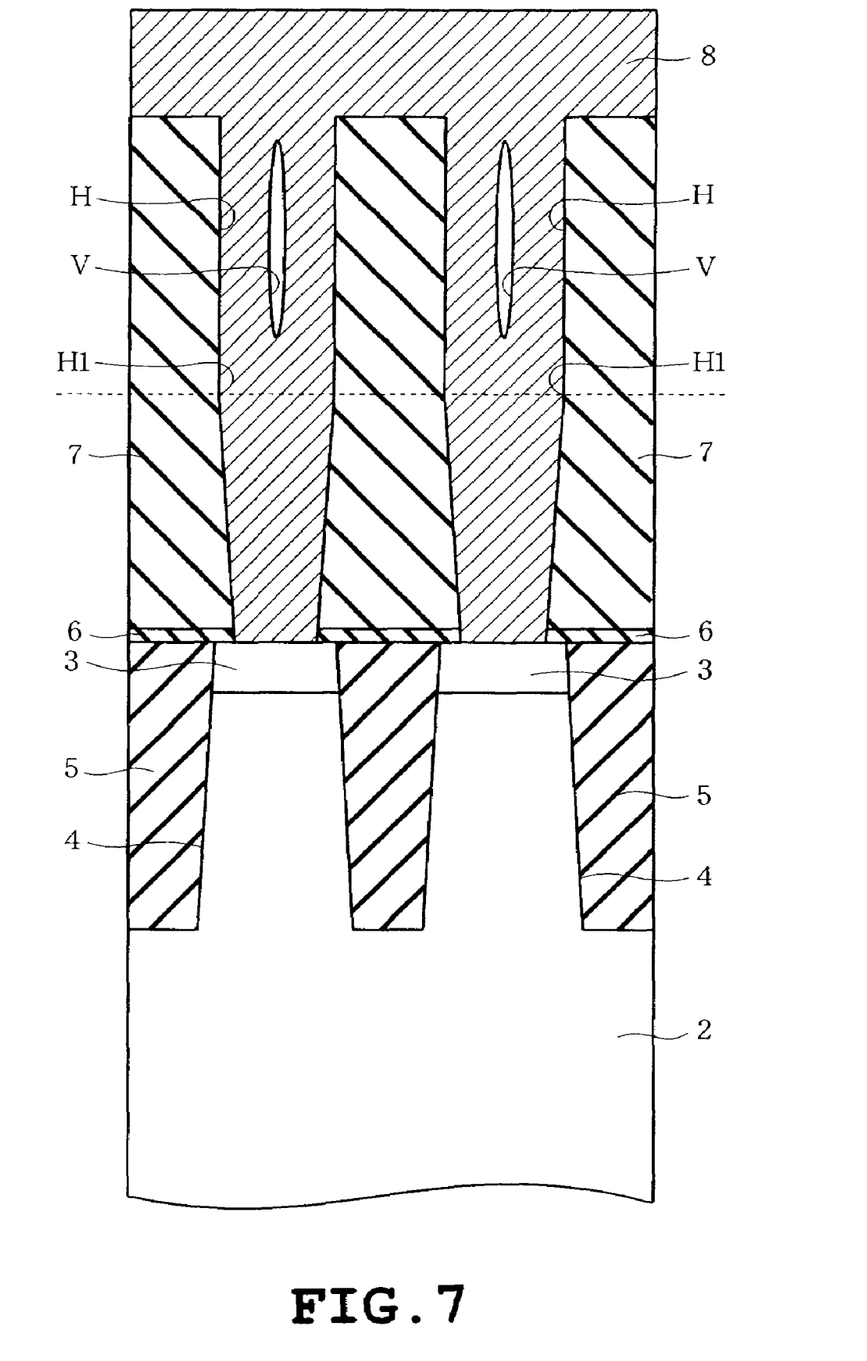

Subsequently, the polycrystalline silicon doped with the impurities is buried in the whole contact hole H as shown in FIG. 7. The polycrystalline silicon doped with the impurities becomes a material for the polyplug 8. In this case, since the part of the contact hole H below the inflection location H1 is tapered so to be downwardly convex, the filling property of the polycrystalline silicon is desirable and no void (seam) occurs. However, void V sometimes occurs in the part of the contact hole H above the inflection location Hi. In view of this problem, the polycrystalline silicon serving as the material for the polyplug 8 is etched back to a predetermined location where no void occurs. Subsequently, a barrier metal film 10 is formed on the upper surface of the remaining polyplug 8 and the inner surface of the contact hole H. Furthermore, the tungsten layer 11 is buried inside the barrier metal film 10. A planarizing process is then carried out by the chemical mechanical polish (CMP) process so that the metal plug 9 is formed.

In etching back the polycrystalline silicon serving as the material for the polyplug 8, it is desirable to adjust a processing time so that etching is carried out to a part of the polycrystalline silicon located slightly below the inflection location H1 so that the part is removed. As a result, the void V occurred in the polyplug 8 can reliably be eliminated such that high resistivity can be suppressed. Subsequently, an electrically conductive layer comprising a metal layer such as an aluminum layer is formed on the metal plug 9, whereby the multilayer wiring structure is composed.

According to the foregoing fabricating method, the silicon nitride film 6 and the interlayer insulating film 7 are formed on the silicon substrate 2. The part of the contact hole H located above the inflection location H1 is formed so as to be vertical relative to the surface of the silicon substrate 2. The part of the contact hole H located below the inflection location H1 is tapered into the downwardly convex shape so that the diameter of the part is gradually reduced downward. The tapered polyplug 8 is formed so that the upper surface thereof is located lower than the inflection location H1 of the contact hole H. The metal plug 9 is formed on the polyplug 8. According to this process, when the polycrystalline silicon serving as the material for the polyplug 8 has been buried in the contact hole H, the void V can be eliminated by removing the polycrystalline silicon covering the void V even if the void is formed above the inflection location H1.

Furthermore, the aspect ratio of contact hole H in which the metal plug 9 is buried can be reduced when the metal plug 9 is formed on the polyplug 8, whereupon the filling property of the metal plug 9 is improved. Accordingly, the high resistivity of the bit line contact CB can be suppressed.

The invention should not be limited by the foregoing embodiment. For example, the embodiment can be modified or expanded as follows. Although the p-type silicon substrate 2 is used as the semiconductor substrate in the foregoing embodiment, the semiconductor substrate may be made from another material.

Furthermore, although the invention is applied to the structure of the bit line contact CB of the NAND flash memory 1 in the foregoing embodiment, the invention may be applied to the structure of a contact area of another semiconductor memory or the structure of a contact plug for electrically connecting between wired portions located over a source/drain region of a transistor. Furthermore, the electrically conductive member buried on the polyplug 8 is not necessarily a metal but may be an electrically conductive member such as polycrystalline silicon which is the same as polyplug 8.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:
1. A semiconductor device comprising:
a semiconductor substrate including an upper surface;
an insulating film formed above the upper surface of the semiconductor substrate, the insulating film including a contact hole penetrating the insulating film, the contact hole including an upper portion, a lower portion located below the upper portion, and a boundary portion connecting the upper portion and the lower portion, the upper portion including an upper end having a first inner width, the boundary portion having a second inner width the same as the first inner width, and the lower portion including a lower end having a third inner width smaller than the second inner width;
a wiring portion formed on the insulating film; and
a contact plug formed in the contact hole, including a first conductive plug formed in the lower portion of the contact hole so that the exposed upper surface of the semiconductor substrate is in contact with the first conductive plug and
a second conductive plug formed on the first conductive plug so that the wiring portion is in contact with the second conductive plug, the first conductive plug comprising a polycrystalline silicon film and the second conductive plug being comprising a conductive material film which differs from the polycrystalline silicon film,
wherein the first and second conductive plugs have an interface with a height that is lower than a height of the boundary portion relative to the upper surface of the semiconductor substrate.

2. The semiconductor device according to claim 1, wherein the second conductive plug is formed into a metal plug provided with a tungsten layer.

3. The semiconductor device according to claim 1, wherein the second conductive plug includes a barrier metal film and a tungsten layer located inside of the barrier metal film.

4. The semiconductor device according to claim 1, wherein the insulating film includes a first inner side wall facing to the upper portion of the contact hole, and the first inner side wall is formed vertically relative to the upper surface of the semiconductor substrate.

5. The semiconductor device according to claim 4, wherein the insulating film includes a second inner side wall facing to the lower portion of the contact hole, and the second inner side wall has a tapered portion relative to the first inner side wall.

6. The semiconductor device according to claim 1, wherein the semiconductor substrate includes an impurity diffusion layer which contact to the first conductive plug.

7. The semiconductor device according to claim 1, further comprising a silicon nitride film between the upper surface and the insulating film.

8. The semiconductor device according to claim 1, further comprising an element isolation insulating film embedded in the upper surface of the semiconductor substrate and a silicon nitride film formed between the element isolation film and the insulating film.

9. A semiconductor device comprising:
a semiconductor substrate including an upper surface;
an insulating film formed above the upper surface of the semiconductor substrate, the insulating film including a contact hole penetrating the insulating film, the contact hole including an upper portion, a lower portion located below the upper portion and a boundary portion connecting the upper portion and the lower portion, the upper portion including an upper end having a first inner width, the boundary portion having a second inner width the same as the first inner width, and the lower portion including a lower end having a third inner width smaller than the second inner width;
a wiring portion formed on the insulating film; and
a contact material formed in the contact hole, including a first conductive material formed in the lower portion of the contact hole so that the exposed upper surface of the semiconductor substrate is in contact to the first conductive material and a second conductive material formed on the first conductive material so that the wiring portion is in contact with the second conductive material, the first conductive material having a first filling property and the second conductive material having a second filling property which is worse than the first filling property of the first conductive material,
wherein the first and second conductive materials have an interface with a height that is lower than a height of the boundary portion relative to the upper surface of the semiconductor substrate.

10. The semiconductor device according to claim 9, wherein the first conductive material includes polycrystalline silicon.

11. The semiconductor device according to claim 10, wherein the second conductive material includes a metal layer.

12. The semiconductor device according to claim 11, wherein the second conductive material includes a tungsten layer.

13. A semiconductor device comprising:
a semiconductor substrate including an upper surface having a plurality of active areas, each active area extending to a first direction;
a plurality of cell units formed on the active areas respectively, each cell unit being located on one of the active areas in a second direction which is perpendicular to the first direction, each cell unit including a pair of selective gate transistors located along the first direction and a plurality of memory cell transistors located along the first direction between the selective gate transistors, respectively;
an insulating film formed above the upper surface of the semiconductor substrate and the cell units, the insulating film including a plurality of contact holes penetrating the insulating film and located along the second direction, each contact hole being located so as to correspond to one of the cell units and located adjacent to one end of said one of the cell units, each contact hole including an upper portion, a lower portion located below the upper portion and a boundary portion connecting the upper portion and the lower portion, the upper portion including an upper end having a first inner width, the boundary portion having a second inner width that is the same as the first inner width, and the lower portion including a lower end having a third inner width that is smaller than the second inner width;
a plurality of bit lines formed on the insulating film, each bit line being located so as to correspond to one of the contact holes; and
a plurality of contact plugs formed in the contact holes, each contact plug including a first conductive plug formed in the lower portion of the contact hole so that the exposed upper surface of the semiconductor substrate is in contact with the first conductive plug and a second conductive plug formed on the first conductive plug so that one of the bit lines is in contact with the second conductive plug, the first conductive plug having a polycrystalline silicon film and the second conductive plug having a conductive material film which differs from the polycrystalline silicon film, the first and second conductive plugs having an interface with a height that is lower than a height of the boundary portion of each contact hole relative to the upper surface of the semiconductor substrate.

14. The semiconductor device according to claim 13, wherein each second conductive plug includes a metal layer.

15. The semiconductor device according to claim 14, wherein the metal layer includes a tungsten material.

16. The semiconductor device according to claim 13, wherein the upper portion of each contact hole has a first inner side wall formed vertically to the upper surface of the semiconductor substrate and the lower portion of each contact hole has a second inner side wall tapered to the upper surface of the semiconductor substrate.

* * * * *